United States Patent
Paton et al.

(10) Patent No.: US 6,905,923 B1
(45) Date of Patent: Jun. 14, 2005

(54) OFFSET SPACER PROCESS FOR FORMING N-TYPE TRANSISTORS

(75) Inventors: Eric N. Paton, Morgan Hill, CA (US); Haihong Wang, Fremont, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/619,877

(22) Filed: Jul. 15, 2003

(51) Int. Cl.⁷ .......................................... H01L 21/8238

(52) U.S. Cl. .................... 438/231; 438/230; 438/199; 438/305

(58) Field of Search ................................ 438/199, 229, 438/230, 231, 303, 305

(56) References Cited

U.S. PATENT DOCUMENTS

| | | | |
|---|---|---|---|
| 4,727,038 A | 2/1988 | Watabe et al. | |
| 4,745,082 A | 5/1988 | Kwok | |
| 4,784,718 A | 11/1988 | Mitani et al. | |
| 5,141,890 A | * 8/1992 | Haken | 438/231 |
| 5,264,382 A | 11/1993 | Watanabe | |
| 5,291,052 A | * 3/1994 | Kim et al. | 257/369 |
| 5,374,575 A | 12/1994 | Kim et al. | |
| 5,384,285 A | * 1/1995 | Sitaram et al. | 438/664 |
| 5,391,510 A | 2/1995 | Hsu et al. | |
| 5,429,956 A | 7/1995 | Shell et al. | |
| 5,491,099 A | 2/1996 | Hsu | |
| 5,593,907 A | 1/1997 | Anjum et al. | |

(Continued)

FOREIGN PATENT DOCUMENTS

| | | |
|---|---|---|
| JP | 3-248433 | 2/1990 |
| JP | 4-123439 | 9/1990 |
| JP | 3248433 | 11/1991 |
| JP | 4123439 | 4/1992 |
| JP | 5160396 | 6/1993 |
| JP | 5-160396 | 6/1993 |
| JP | 10-270685 | 10/1998 |
| JP | 410270685 | 10/1998 |

OTHER PUBLICATIONS

International Electron Devices Meeting 1997, "Sub–100nm Gate Length Metal Gate NMOS Transistors Fabricated by a Replacement Gate Process" by Chatterjee et al, pp. 821–824.

International Electron Devices Meeting 1999, "70nm MOSFET with Ultra–Shallow, Abrupt, and super–Doped S/D Extension Implemented by Laser Thermal Process (LPT)" by Yu et al, pp. 509–512.

Bin Yu, et al., 70nm MOSFET with Ultra–Shallow, Abrupt, and Super–Doped S/D Extension Implemented by Laser Thermal Process (LTP), 1999 International Electron Devices Meeting; Technical Digest, Washington, DC; Dec.5–8, 1999 (6 pgs.).

A. Chatterjee, et al., Sub–100nm Gate Length Metal Gate NMOS Transistors Fabricated by a Replacement Gate Process, 1997 International Electron Devices Meeting, Technical Digest, Washington, DC; Dec. 7–10, 1997 (5 pgs.).

*Primary Examiner*—Amir Zarabian
*Assistant Examiner*—Christy Novacek
(74) *Attorney, Agent, or Firm*—Foley & Lardner LLP

(57) ABSTRACT

A method of fabricating an SMOS integrated circuit with source and drain junctions utilizes an offset gate spacer for N-type transistors. Ions are implanted to form the source and drain regions in a strained layer. The offset spacer reduces problems associated with Arsenic (As) diffusion on strained semiconductor layers. The process can be utilized for SMOS metal oxide semiconductor field effect transistors (MOSFETs). The strained layer can be a strained silicon layer formed above a germanium layer.

21 Claims, 3 Drawing Sheets

U.S. PATENT DOCUMENTS

| | | | |
|---|---|---|---|
| 5,595,919 A | | 1/1997 | Pan |
| 5,624,871 A | * | 4/1997 | Teo et al. .................. 438/453 |
| 5,654,212 A | * | 8/1997 | Jang .......................... 438/231 |
| 5,675,159 A | | 10/1997 | Oku et al. |
| 5,716,681 A | | 2/1998 | Moslehi |
| 5,716,861 A | | 2/1998 | Moslehi |
| 5,736,446 A | | 4/1998 | Wu |
| 5,825,066 A | | 10/1998 | Buynoski |
| 5,856,225 A | | 1/1999 | Lee et al. |
| 5,858,843 A | | 1/1999 | Doyle et al. |
| 5,915,182 A | | 6/1999 | Wu |
| 5,915,196 A | | 6/1999 | Mineji |
| 5,998,807 A | * | 12/1999 | Lustig et al. ................. 257/66 |
| 5,998,873 A | * | 12/1999 | Blair et al. ................. 257/766 |
| 6,030,863 A | | 2/2000 | Chang et al. |
| 6,153,484 A | | 11/2000 | Donaton et al. |
| 6,184,097 B1 | | 2/2001 | Yu |
| 6,356,476 B1 | | 3/2002 | Kang |
| 6,365,476 B1 | | 4/2002 | Talwar et al. |
| 6,444,532 B2 | | 9/2002 | Hasegawa |
| 6,506,654 B1 | | 1/2003 | Wei et al. |
| 6,559,015 B1 | | 5/2003 | Yu |
| 6,649,492 B2 | * | 11/2003 | Chu et al. ................... 438/478 |
| 6,689,671 B1 | * | 2/2004 | Yu et al. .................... 438/486 |
| 6,762,085 B2 | * | 7/2004 | Zheng et al. ............... 438/199 |
| 2001/0003364 A1 | | 6/2001 | Sugawara et al. |
| 2003/0068883 A1 | | 4/2003 | Ajmera et al. |
| 2003/0153161 A1 | | 8/2003 | Chut et al. |

* cited by examiner

OFFSET SPACER PROCESS FOR FORMING N-TYPE TRANSISTORS

CROSS REFERENCE TO RELATED APPLICATIONS

This patent application is related to U.S. application Ser. No. 09/255,604, filed on Feb. 22, 1999 by Yu, entitled "A Process for Forming Ultra-Shallow Source/Drain Extensions" (now U.S. Pat. No. 6,184,097) and is also related to U.S. application Ser. No. 10/440,734, filed on May 19, 2003 by Paton, et al., entitled "Disposable Spacer SMOS Process for Forming N-Type Source/Drain Extensions", both of which are incorporated herein by reference and assigned to the assignee of the present invention.

FIELD OF THE INVENTION

The present invention relates to integrated circuits and methods of manufacturing integrated circuits. More particularly, the present invention relates to a method of manufacturing SMOS integrated circuits having transistors with source and drain extensions.

BACKGROUND OF THE INVENTION

Integrated circuits (ICs), such as ultra-large scale integrated (ULSI) circuits, can include as many as one million transistors or more. The ULSI circuit can include complementary metal oxide semiconductor (CMOS) field effect transistors (FETs). The transistors can include semiconductor gates disposed between drain and source regions. The drain and source regions are typically heavily doped with a P-type dopant (e.g., boron) or an N-type dopant (e.g., phosphorous or arsenic).

The source and drain regions generally include a thin extension that is disposed partially underneath the gate to enhance transistor performance. Shallow source and drain extensions help to achieve immunity to short-channel effects which degrade transistor performance for both N-channel and P-channel transistors. Short-channel effects can cause threshold voltage roll-off and drain-inducted barrier lowering. Controlling short-channel effects is particularly important as transistors become smaller.

Conventional techniques utilize a double implant process to form deeper source and drain regions and shallow source and drain extensions. According to the conventional process, source and drain extensions are formed by providing a transistor gate structure without sidewall spacers on a top surface of a silicon substrate. The silicon substrate is doped on both sides of the gate structure via a conventional doping process such as a thermal diffusion process or an ion implantation process. Without the sidewall spacers, the doping process introduces dopants into a thin region (i.e., just below the top surface of the substrate) to form the source and drain extensions, as well as to partially form the source and drain regions.

After the source and drain extensions are formed, silicon dioxide or silicon nitride spacers, which abut lateral sides of the gate structure, are provided over the source and drain extensions. The substrate is doped a second time to form the deeper source and drain regions, which are necessary for proper silicidation. The source and drain extensions are not further doped due to the blocking capability of the silicon dioxide spacer.

SMOS processes are utilized to increase transistor (MOSFET) performance by increasing the carrier mobility of silicon, thereby reducing resistance and power consumption and increasing drive current, frequency response, and operating speed. Strained silicon is typically formed by growing a layer of silicon on a silicon germanium substrate or layer. Germanium can also be implanted, deposited, or otherwise provided to silicon layers to change the lattice structure of the silicon and increase carrier mobility.

The silicon germanium lattice associated with the germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another. Relaxed silicon has a conductive band that contains six equal balance bands. The application of tensile strength to the silicon causes four of the balance bands to increase in energy and two of the balance bands to decrease in energy. As a result of quantum effects, electrons effectively weigh 30 percent less when passing through the lower energy bands. Thus, lower energy bands offer less resistance to electron flow.

In addition, electrons meet with less vibrational energy from the nucleus of the silicon atom, which causes them to scatter at a rate of 500 to 1,000 times less than in relaxed silicon. As a result, carrier mobility is dramatically increased in strained silicon compared to relaxed silicon, providing an increase in mobility of 80 percent or more for electrons and 20 percent or more for holes. The increase in mobility has been found to persist for current fields up to 1.5 megavolt/centimeter. These factors are believed to enable device speed increase of 35 percent without further reduction of device size, or a 25 percent reduction in power consumption without a reduction in performance.

Heretofore, forming source and drain extensions on strained semiconductor layers has been difficult using conventional double implant processes. For example, compensation is required for N-type dopants to reduce enhanced lateral diffusion under the edge of the gate. Enhanced lateral diffusion causes overlap of source and drain extensions in the channel, thereby resulting in short channel effects.

Low annealing temperatures and low thermal budgets are often utilized to reduce short channel effects. However, low annealing temperatures and low thermal budgets can cause suppressed diffusion of P-type dopants in strained silicon. Suppressed boron diffusion can prevent sufficient overlap of the gate and the source and drain regions, thereby resulting in lower drive currents ($1_{d(sat)}$).

Thus, there is a need for an SMOS process which compensates for the adverse effects of enhanced lateral diffusion of N-type dopants and yet allows sufficient diffusion of P-type dopants. Further still, there is a need for a process optimized to reduce short channel effects associated with diffusion of source and drain extensions. Yet further, there is a need for SMOS transistors that are less susceptible to short channel effects. Even further still, there is a need for an efficient method of fabricating source and drain regions in an SMOS process.

SUMMARY OF THE INVENTION

An exemplary embodiment relates to a method of manufacturing an integrated circuit. The method includes providing a first gate structure and a second gate structure on a semiconductor substrate including a strained semiconductor layer. The first gate structure and the second gate structure each include a first spacer. The first gate structure is provided above a first area of the strained semiconductor layer and the second gate structure is provided above a second area of the strained semiconductor layer. The method also includes providing a first masking layer above the first area, forming first deep source and drain regions in the strained semiconductor layer in the second area, removing the first masking layer, and masking the second area with a second masking layer. The method also includes providing a second spacer to the first gate structure and forming second deep source and drain regions in the strained semiconductor layer in the second area.

Another exemplary embodiment relates to a method of manufacturing an ultra-large scale integrated circuit including a plurality of field effect transistors having gate structures. The method includes steps of selectively providing deep source and drain regions for a first group of the field effect transistors, selectively providing offset spacers for a second group of the field effect transistors, and selectively providing source and drain regions for the second group. The second group of field effect transistors is different than the first group of the field effect transistors. The first group and the second group are provided on a top surface of a strained semiconductor layer.

Still another exemplary embodiment relates to a process of forming source and drain regions on a semiconductor substrate. The process includes forming a plurality of gate structures on a top surface of a strained silicon layer, covering a first set of gate structures, forming deep source and drain regions on each side of the second set of the gate structures, and uncovering the first set of gate structures. The method further includes covering the second set of gate structures, providing spacers for the first set of gate structures, and forming deep source and drain regions on each side of the first set of the gate structures.

BRIEF DESCRIPTION OF THE DRAWINGS

Exemplary embodiments of the present invention will hereafter be described with reference to the accompanying drawings, wherein like numerals denote like elements.

DETAILED DESCRIPTION OF THE PREFERRED AND EXEMPLARY EMBODIMENTS

Figure 1:
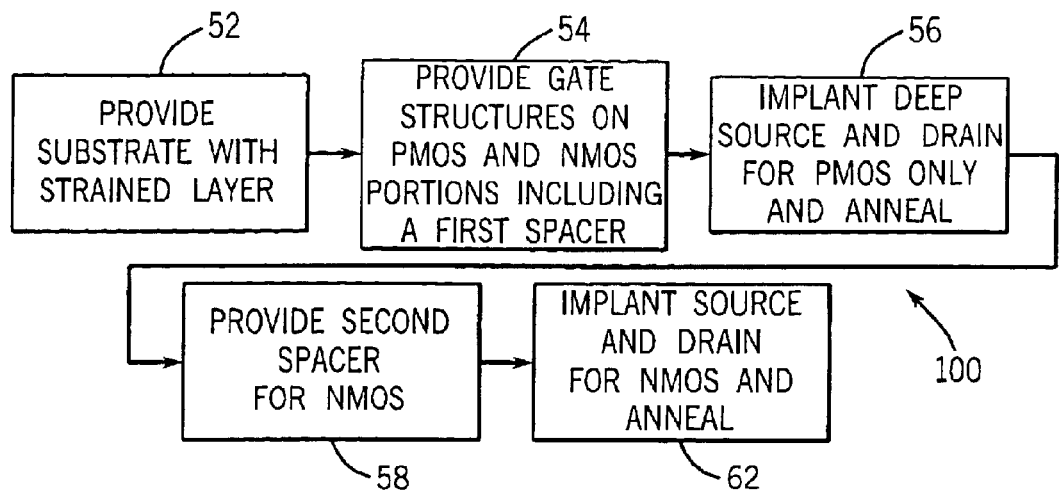
FIG. 1 is a general flow diagram showing an SMOS process for forming source and drain regions for N-type and P-type transistors in accordance with an exemplary embodiment of the present invention.
Figure 7:
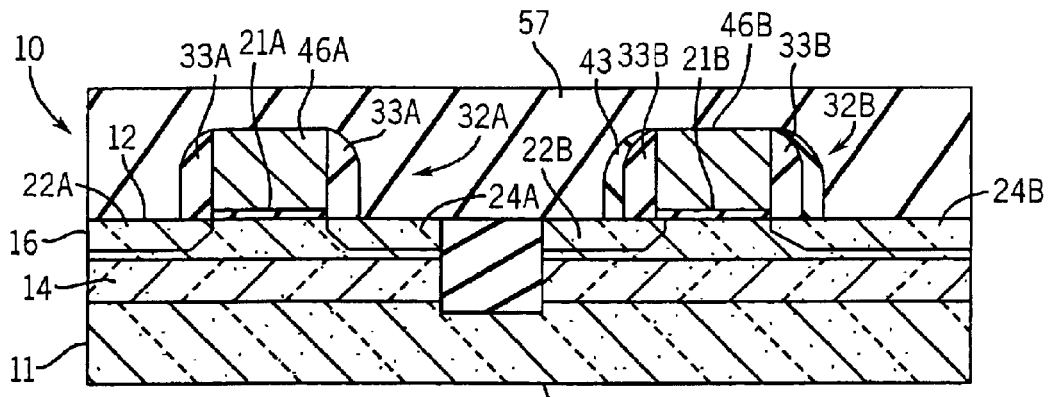
FIG. 7 is a schematic cross-sectional view of the portion of the integrated circuit substrate illustrated in FIG. 6, showing an insulative layer deposition step.

With reference to FIGS. 1 and 7, a portion 10 of a strained semiconductor (SMOS) integrated circuit 12 (FIG. 7) is manufactured in a process 100 (FIG. 1). In one embodiment, process 100 forms transistors in a strained layer above a compound semiconductor layer. The transistors are less susceptible to short channel effects caused by lateral diffusion due to the use of offset spacers in process 100.

Integrated circuit 12 can include a semiconductor device or portion thereof made from any of the various semiconductor processes such as a complementary metal oxide semiconductor (CMOS) process or any other semiconductor process. Portion 10 of integrated circuit 12 shown in FIG. 7 may be an entire IC or a portion of an IC and may include a multitude of electronic components. Preferably, integrated circuit 12 includes at least a P-channel and an N-channel SMOS field effect transistor on respective first and second areas of portion 10.

As shown in FIGS. 2–7 and 9, reference numerals reflecting the same number reflect similar structures on areas of portion 10. In one embodiment, the area associated with gate structure 32A is an area for P-type transistors. Conversely, the area associated with gate structure 32B is an area for N-type transistors. An isolation structure such as shallow trench isolation structure or LOCOS structure can separate the transistors associated with gate structures 32A and 32B.

With reference to FIG. 7, integrated circuit 12 includes a semiconductor/germanium layer, such as a silicon/germanium layer 14, a strained semiconductor layer, such as a strained silicon layer 16, and a substrate 13. Gate structures 32A–B are disposed between source and drain regions 22A–B and 24A–B. Source and drain regions 22A–B and 24A–B can include extensions.

Process 100 can be utilized to form integrated circuit 12. According to process 100, integrated circuit 12 is formed by providing source and drain regions 22B and 24B (for NMOS) after an offset spacer is provided. The offset spacer increases the distance between regions 22B and 24B and an edge of gate conductor 46B. The increased distance compensates for the enhanced lateral diffusion of arsenic (As) dopants which are particularly problematic for NMOS transistors formed on strained layers. Regions 22A and 24A for PMOS transistors are formed without a second spacer or an offset spacer because diffusion of P-type dopants such as boron (B) is suppressed in strained layers.

At a step 52, process 100 provides a substrate with a strained semiconductor layer such as layer 16 (FIG. 7). In a step 54, gate structures (structures 32A–B) with a first spacer material (spacers 33A–B in FIG. 7) are provided above the strained layer. At a step 56, source and drain regions 22A and 24A are provided. Preferably, gate structure 32B is covered with a masking material and regions 22A and 24A are doped in an ion implantation process. Regions 22A and 24A are subsequently annealed.

At a step 58, the masking material above gate structure 32B is removed and a masking material is provided over gate structure 32A. A second spacer or offset spacer, such as spacer 43 (FIG. 7), is provided to gate structure 32B. In a step 62, source and drain regions 22B and 24B are provided. Regions 22B and 24B can be doped by an ion implantation process. Regions 22B and 24B are subsequently annealed.

In one alternative embodiment, gate structure 32A can also include spacers such as spacer 43. In such an embodiment, the masking layer can be provided after spacers 43 are provided. Such process protects the masking layer from the etch-back step associated with the formation of spacers 43.

Gate structures 32A–B (FIG. 7) between source and drain regions 22A–B and 24A–B include gate conductors 46A–B and gate dielectrics 21 A–B. Gate dielectrics 21 A–B are preferably 5–30 Angstroms thick. Gate dielectrics 21 A–B can be silicon dioxide ($SiO_2$), silicon nitride ($Si_3N_4$), or another high-k dielectric material.

Gate conductors 46A–B are surrounded by dielectric spacers 33A–B. Gate conductors 46A–B can be a metal or doped polysilicon material approximately 500–2000 Å thick. Dielectric spacers 33A–B can be comprised of a silicon dioxide or silicon nitride material.

Gate structure 32B includes offset spacers 43. Offset spacers 43 are preferably between approximately 50 and 200 Å wide and approximately 500–2000 Å thick. In a preferred embodiment, the combination of spacers 43 and 33B have a width of 500 angstroms. According to an exemplary embodiment, spacers 33A and 33B can have a width of approximately 500 angstroms and a height of between approximately 500 and 2000 angstroms.

Spacers 43 can be the same or different material than spacers 33B. In one embodiment, spacers 33B are silicon dioxide and spacers 43 are silicon nitride.

Source and drain regions 22A–B and 24A–B preferably extend through the entire thickness or nearly the entire thickness (i.e., at least 75%) of layer 16. Source regions 22A–B and drain region 24A–B are preferably approximately 1000 angstroms deep and are formed by ion implantation.

Preferably, process 100 advantageously utilizes a doping technique which compensates for the lateral and vertical diffusion associated with source and drain extensions. Regions 22A–B and 24A–B can have a concentration of between approximately $10^{19}$ to $10^{21}$ dopants per $cm^3$. The dopants can include boron (B) (P-type), arsenic (As) (Ntype), phosphorous (P), boron difluoride ($BF_2$), etc. In the embodiment in which the transistor of gate structure 32B is an NMOS transistor and the transistor of gate structure 32A is a PMOS transistor, regions 22B and 24B are preferably doped with arsenic (As) and regions 22A and 24A are doped with boron (B).

Referring to FIGS. 2 through 7, a cross-sectional view of the portion of integrated circuit (IC) 12 is illustrated. Integrated circuit 12 is subjected to process 100 (FIG. 1) to form an integrated circuit 12 including at least two transistors. Integrated circuit 12 can include a multitude of SMOS transistors with gate structures 32A–B and silicided source and drain regions 22A–B and 24A–B fabricated as explained below.

Figure 2:
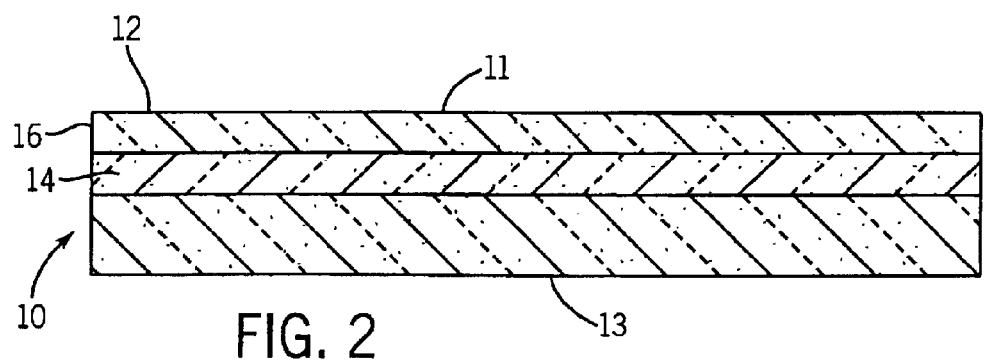
FIG. 2 is a schematic cross-sectional view of a portion of an integrated circuit substrate for use in the process illustrated in FIG. 1, the integrated circuit substrate includes a strained semiconductor layer.

In FIG. 2, a multilayer structure 11 is provided as an integrated circuit wafer including a strained layer such as strained silicon layer 16 provided over a semiconductor/germanium layer such as silicon/germanium layer 14. Layer 14 can be provided above substrate 13.

Substrate 13 is optional and integrated circuit 12 can be provided with layer 14 as the bottom-most layer. Substrate 13 can be the same material or a different material than layer 14. In one embodiment, substrate 13 is a semiconductor substrate, such as a silicon substrate upon which layer 14 has been grown.

Silicon/germanium layer 14 is preferably a silicon germanium or other semiconductor material including germanium, and can be doped with P-type dopants or N-type dopants. Layer 14 can be an epitaxial layer provided on a semiconductor or an insulative base, such as substrate 13. Furthermore, layer 14 is preferably a composition of silicon germanium ($Si_{1-x}Ge_x$, where X is approximately 0.2 and is more generally in the range of 0.05–0.3). Layer 14 can be grown or deposited.

In one embodiment, layer 14 is grown above substrate 13 by chemical vapor deposition (CVD) using disilane ($Si_2H_6$) and germane ($GeH_4$) as source gases with a substrate temperature of approximately 650° C., a disilane partial pressure of approximately 30 mPa and a germane partial pressure of approximately 60 mPa. Growth of silicon germanium material may be initiated using these ratios, or, alternatively, the partial pressure of germanium may be gradually increased beginning from a lower pressure or zero pressure to form a gradient composition. Alternatively, a silicon layer can be doped by ion implantation with germanium or by another process to form layer 14. Preferably, silicon/germanium layer 14 is grown by epitaxy to a thickness of less than approximately 5000 angstroms (and preferably between approximately 1500 angstroms and 4000 angstroms).

Strained silicon layer 16 is formed above layer 14 by an epitaxial process. Preferably, layer 16 is grown by CVD at a temperature of approximately 600° C. Layer 16 can be a pure silicon layer and have a thickness of up to 500 angstroms. Preferably, layer 16 is 50–150 angstroms thick. Layer 14 maintains the strained nature of layer 16 throughout process 100.

Layers 14 and 16 can include isolation regions which separate active regions for transistors on structure 11. Isolation regions can be insulating regions such as silicon dioxide regions formed in conventional local oxidation of silicon (LOCOS) processes. Alternatively, isolation regions can be formed in a shallow trench isolation (STI) process.

Figure 3:
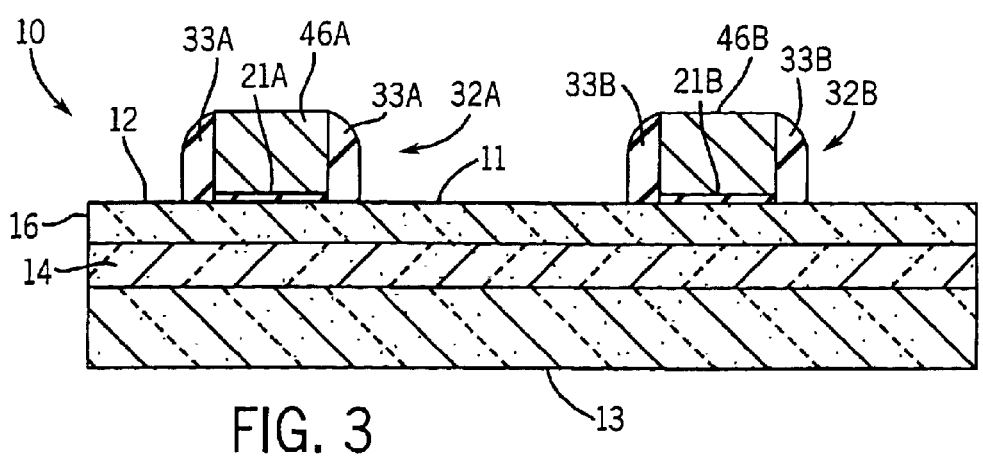
FIG. 3 is a cross-sectional view of the portion of the integrated circuit illustrated in FIG. 2, showing a providing a pair of gate structures step.

In FIG. 3, gate structures 32A–B including gate conductors 46A–B, spacers 33A–B, and gate dielectrics 21A–B are formed above a top surface of layer 16 in step 54. In one embodiment, spacers 33A–B can be silicon dioxide ($SiO_2$) spacers formed in a conventional deposition (e.g., CVD) and etch-back process. Spacers 33A–B can be 500 angstroms wide and 500–2000 angstroms tall. Alternatively, spacers 33A–B can be silicon nitride ($Si_3N_4$) or another insulative material.

Gate dielectrics 21A–B are preferably a thermally grown or deposited silicon dioxide layer. Alternatively, gate dielectrics 21A–B can be a silicon nitride layer or can be a high-k gate dielectric layer. In one embodiment, gate dielectrics 21A–B are a 5–30 angstroms thermally grown silicon dioxide layers.

Conductors 46A–B and gate dielectrics 21 A–B of gate structures 32A–B are preferably lithographically patterned. Conductors 46A–B are formed from a 500–2,000 angstroms thick metal or polysilicon layer. In a preferred embodiment, conductors 46A–B are doped polysilicon layers deposited by chemical vapor deposition (CVD).

Figure 4:
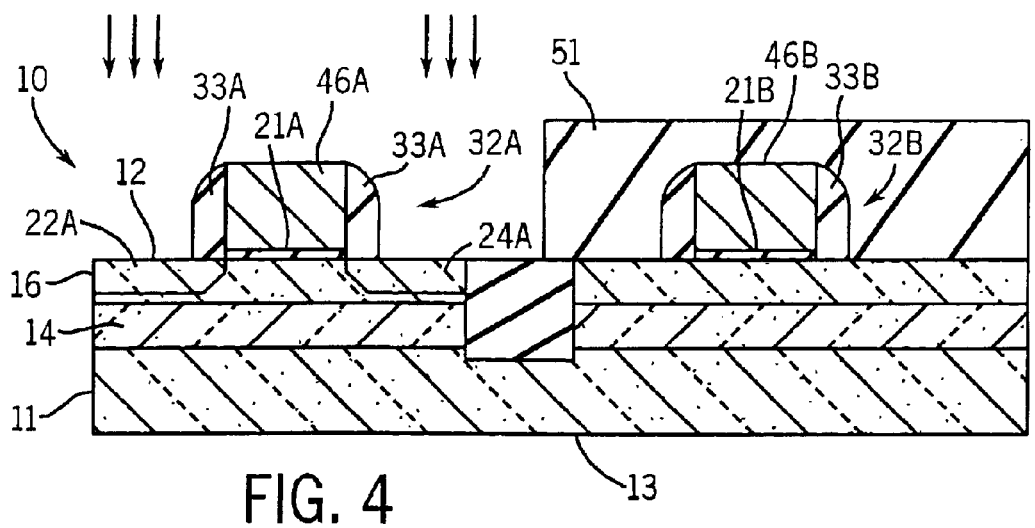
FIG. 4 is a schematic cross-sectional view of the portion of the integrated circuit substrate illustrated in FIG. 3, showing a deep source and drain doping step.

In FIG. 4, the portion of integrated circuit 12 associated with gate structure 32B is masked. Preferably, a masking layer 51 is provided above the surface associated with the area of portion 10 associated with gate structure 32B. Preferably, masking layer 51 is an approximately 2500 angstrom thick layer of UV photoresist material. Layer 51 does not cover the portion of integrated circuit 12 associated with gate structure 32A. Layer 51 can be provided by spin coating, deposition, or other application techniques. Preferably, layer 51 covers gate structure 32B.

After layer 51 is provided, portion 10 is subjected to an ion implantation process to form source and drain regions 22A and 24A. The ion implantation process dopes layer 16 to form deep source and drain regions (regions 22A and 24A). Preferably, an ion implantation technique is utilized to form regions 22A and 24B. For a P-type transistor for gate structure 32A, regions 22A and 24A are heavily doped with boron (B) dopants and subjected to a rapid thermal annealing (RTA) process to appropriately diffuse and activate the dopants within layer 16. Preferably, an energy of approximately 2.2 keV and a dose of approximately 1e 18 atoms/cm$^2$ of BF$_2$ is utilized to implant regions 22A and 24A having a depth of approximately 300 angstroms. A spike anneal at a temperature of between approximately 1100 and 1300° C. may then be utilized.

Figure 5:
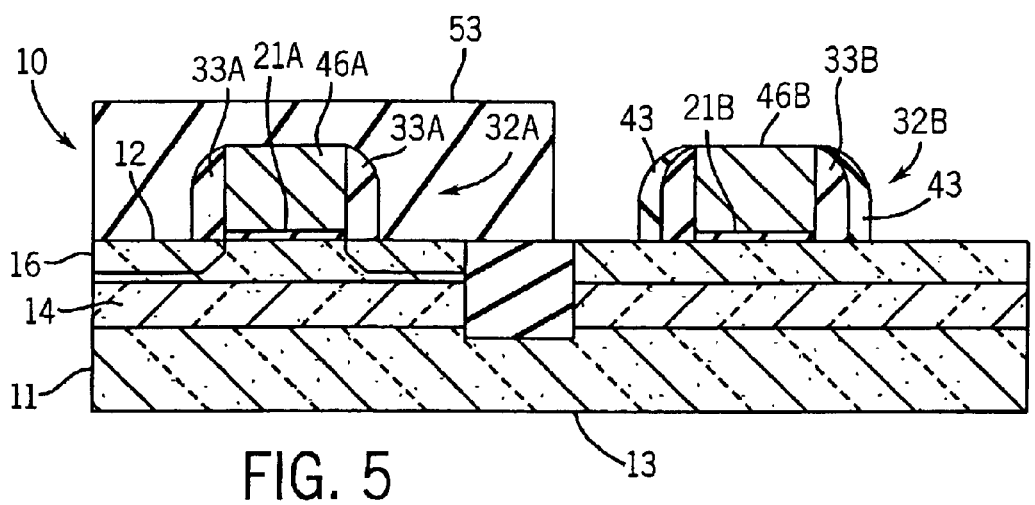
FIG. 5 is a schematic cross-sectional view of the portion of the integrated circuit substrate illustrated in FIG. 4, showing a providing an offset spacer step.

In FIG. 5, layer 51 is stripped in step 58 of process 100. In one embodiment, a chemical wet-etching process is utilized to remove layer 51. In another embodiment, a dry etching process such as a plasma dry etch process is utilized. Removing layer 51 exposes layer 16 at an area associated with gate structure 32B.

After layer 51 is stripped, a masking layer 53 similar to layer 51 is provided selectively above layer 16 and gate structure 32A (FIG. 5). In particular, layer 53 covers an area associated with gate structure 32A. After layer 53 is provided, an offset spacer or second spacer 43 is provided to gate structure 32B in step 58.

Spacer 43 can be provided in a deposition and etch-back process. Spacer 43 can be similar to spacer 33B. In one preferred embodiment, spacer 43 is SiN material, is 500–2,000 angstroms tall and approximately 100 angstroms wide at its base. The width of spacers 43 and 33B provides sufficient distance to prevent adverse effects of enhanced lateral diffusion associated with doping regions 22B and 24B.

Figure 6:
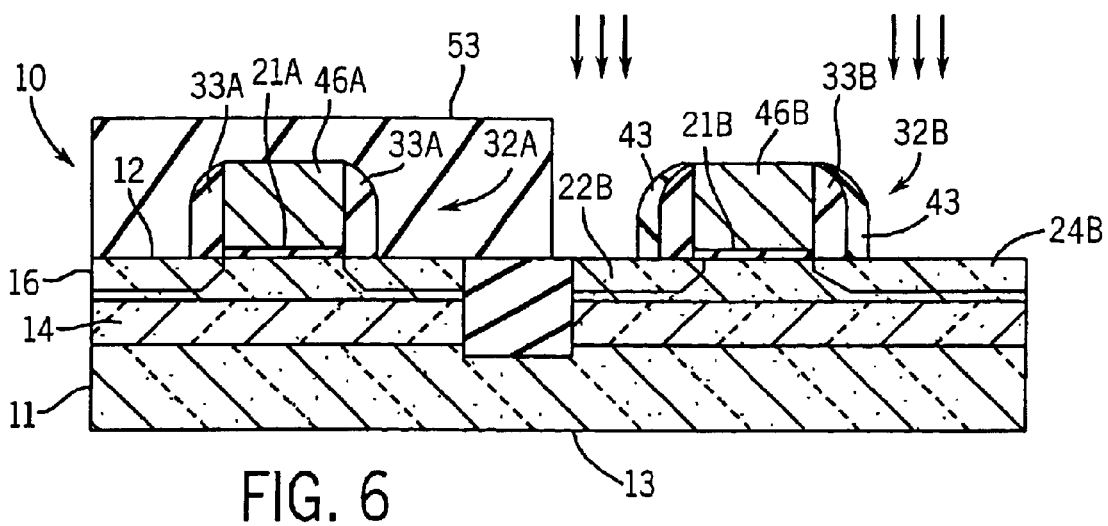
FIG. 6 is a schematic cross-sectional view of the portion of the integrated circuit substrate in FIG. 5, showing another deep source and drain doping step.

In FIG. 6, after spacer 43 is provided, layer 16 is doped to provide dopants for NMOS transistors in step 58. Layer 16 is doped to form deep source and drain regions (regions 22B and 24B). Preferably, an ion implantation technique is utilized to form regions 22B and 24B. In N-type transistor, regions 22B and 24B are heavily doped with arsenic (As) dopants and subjected to a rapid thermal anneal process to appropriately diffuse and activate the dopants within layer 16. Preferably, an energy of approximately 3.0 keV and a dose of approximately 1 e18 atoms/cm$^2$ is utilized to implant regions 22B and 24B having a depth of approximately 300 angstroms.

Regions 22A–B and 24A–B as well as gate conductors 46A–B can be silicided in a conventional process. In FIG. 7, an insulative layer 57 can be provided above gate structures 32A–B and source and drain regions 22A–B and 24A–B. Layer 57 can be a 4,000–6,000 angstroms thick silicon dioxide layer deposited by tetraethylorthosilicate (TEOS) techniques.

According to an alternative embodiment of process 100, a reverse order can be utilized in which gate structure 32B and the area associated with the NMOS transistors is covered. In this embodiment, source region 22B and drain region 24B are formed before source region 22A and drain region 24A. However, the preferred embodiment of process 100 utilizes the order described with reference to FIGS. 2–7 in which regions 22A and 24A are formed first to prevent enhanced diffusion of dopants associated with the N-type transistor. The annealing steps associated with the P-type transistor (gate structure 32A) may cause additional diffusion of N-type dopants if regions 22B and 24B are formed first.

Figure 8:
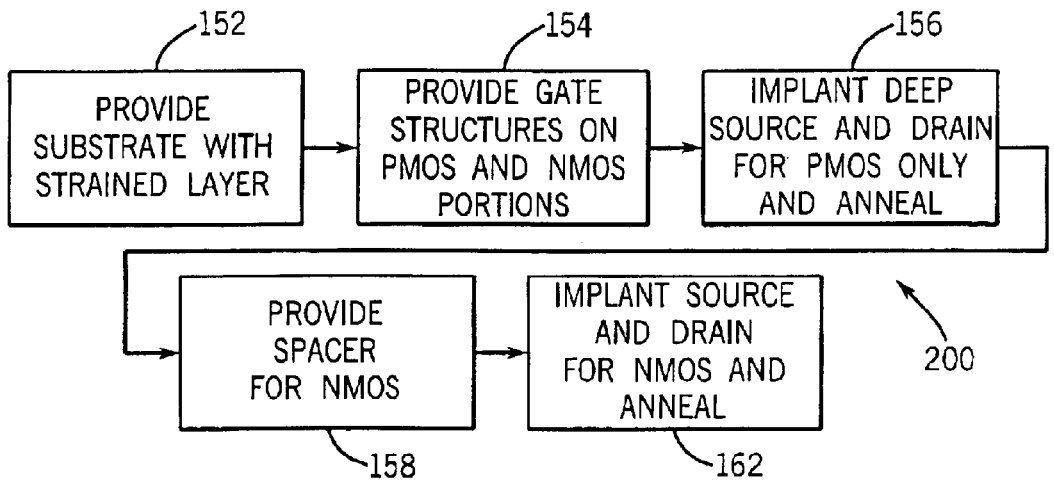
FIG. 8 is a general flow diagram showing an SMOS process for forming source and drain regions for N-type and P-type transistors in accordance with another exemplary embodiment.
Figure 9:
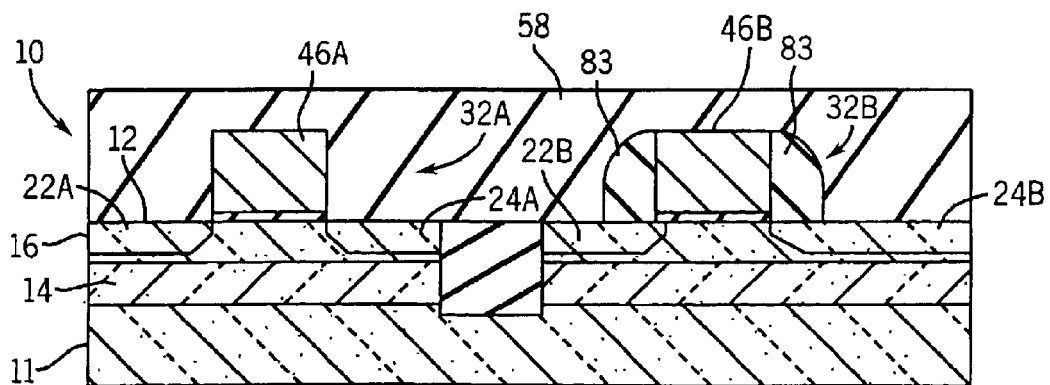
FIG. 9 is a schematic cross-sectional view of a portion of the integrated circuit substrate in accordance with another exemplary embodiment manufactured by the process illustrated in FIG. 8.

With reference to FIG. 8, a process 200 includes similar steps to process 100. However, process 200 utilizes a zero spacer technique for PMOS transistors. In a step 152, similar to step 52, a substrate is provided with a strained layer. In a step 154, similar to step 54, a gate structure is provided on NMOS and PMOS portions of the integrated circuit, such as integrated circuit 12. However, the gate structures are unlike gate structures 32A and 32B in that a first spacer is not provided. As shown in FIG. 9, gate structure 32A does not include spacers 33A (FIG. 7. Gate structure 32A is shown without any spacers (e.g., a zero spacer process). Such a structure is particularly advantageous in strained silicon processes in which boron diffusion is retarded.

In step 156, deep source and drain regions 22A and 24A are formed for the transistor associated with gate structure 32A. Preferably, the gate structure associated with 32A is utilized in a P-channel transistor. In a step 158, spacers 83 are provided to gate structure 32B. Spacers 83 act as an offset spacer for the formation of source region 22B and drain region 24B. At a step 162, source and drain regions are implanted for the transistor associated with gate structure 32B. Preferably, gate structure 32B is associated with an N-type transistor.

Spacers 83 can be fabricated similar to spacers 33A and 33B (FIG. 7). Other elements with similar reference numerals in FIG. 9 can have dimensions and can be manufactured from materials similar to the materials described with reference to FIG. 7.

The selected provision of spacers 83, source and drain regions 22A and 24A, and source and drain regions 22B and 24B can be achieved by the use of masking layers similar to layers 51 and 53 described with reference to FIGS. 4 and 5.

In one embodiment, source and drain regions 22A and 22B are completed in processes 100 and 200 after extensions are formed in a conventional lightly doped drain (LDD) process. In an alternative embodiment, a removable spacer can be utilized so that extensions are formed after the deep areas associated with source and drain regions 22A–B are formed. Such a technique is described in related patent application entitled "Disposable Spacer SMOS Process for Forming N-Type Source/Drain Extensions" by Paton et al. and incorporated herein by reference.

Processes 100 and 200 can be designed to have low annealing temperatures. Low annealing temperatures are conventionally used for diffusion after annealing temperatures (low Bt) at different levels (D$_i$) in strained layers, such as layer 16. Applicants believe that in SMOS processes, the As/B diffusion differential can be reduced for anneals performed below a temperature of approximately 700° C. For example, a solid phase epitaxy (SPE) anneal at a temperature of 550–650° C. for 1–3 minutes can reduce the diffusion differential between arsenic and boron. Further, a low temperature (e.g., 900° C.–1,000° C.) anneal for approximately 10 seconds may also reduce the diffusion differential. According to an alternative embodiment, a spike anneal as described above may be utilized.

In another embodiment, the area associated with transistors of gate structure 32A (P-channel transistors) can be provided with a compressive strain to improve mobility. Poor mobility in the P-channel is an acute problem in SMOS technology, where N-channel mobility is increased by a large factor such that the imbalance between PMOS and NMOS transistors becomes even worse. In such an embodiment, gate structure 32A is implanted with germanium to provide higher mobility.

It is understood that while preferred embodiments, examples, materials, and values are given, they are for the purpose of illustration only. The apparatus and method of the invention are not limited to the precise details and conditions disclosed. For example, although implantation of arsenic and boron dopants are discussed, other doping methods and dopants could be utilized. Thus, changes may be made to the details disclosed without departing from the spirit of the invention, which is defined by the following claims.

What is claimed is:

1. A method of manufacturing an integrated circuit, the method comprising:

providing a first gate structure and a second gate structure on a semiconductor substrate including a strained semiconductor layer, the first gate structure and the second gate structure each including a first spacer, wherein the first gate structure is provided above a first area of the strained semiconductor layer and the second gate structure is provided above a second area of the strained semiconductor layer;

providing a first masking layer above the first area;

forming first deep source and drain regions in the strained semiconductor layer in the second area;

removing the first masking layer;

masking the second area with a second masking layer;

selectively providing a second spacer to the first gate structure; and forming second deep source and drain regions in the strained semiconductor layer in the first area after the step of selectively providing a second spacer to the first gate structure;

wherein the first gate structure is part of an NMOS transistor and the second gate structure is part of a PMOS transistor.

2. The method of claim 1, further comprising:

siliciding the first and second gate structures and the first and second source and drain regions.

3. The method of claim 1, wherein the first and second gate structures includes a polysilicon conductor.

4. The method of claim 1, further comprising:

covering at least a portion of the semiconductor substrate with an insulative layer.

5. The method of claim 1, wherein the second spacers are approximately 500 angstroms wide.

6. The method of claim 5, wherein the second source and drain regions include Arsenic.

7. The method of claim 1, further comprising:

activating the first and second deep source and drain regions in an annealing process.

8. The method of claim 7, wherein the annealing process operates at less than 600° C.

9. The method of claim 8, wherein the removing step is a dry-etching step.

10. A method of manufacturing an integrated circuit, the method comprising:

providing a first gate structure and a second gate structure on a semiconductor substrate including a strained semiconductor layer, the first gate structure and the second gate structure each including a first spacer, wherein the first gate structure is provided above a first area of the strained semiconductor layer and the second gate structure is provided above a second area of the strained semiconductor layer;

providing a first masking layer above the first area;

forming first deep source and drain regions in the strained semiconductor layer in the second area;

removing the first masking layer;

masking the second area with a second masking layer;

selectively providing a second spacer to the first gate structure;

forming second deep source and drain regions in the strained semiconductor layer in the first area; and activating the first and second deep source and drain regions in an annealing process;

wherein the annealing process operates at less than 600° C.

wherein the removing step is a dry-etching step; and wherein the first and second spacers comprise nitride.

11. A method of manufacturing an ultra-large scale integrated circuit including a plurality of field effect transistors having gate structures comprising spacers, the method comprising the steps of:

selectively providing deep source and drain regions for a first group of the field effect transistors;

selectively providing offset spacers adjacent the spacers of a second group of the field effect transistors, the second group of the field effect transistors being NMOS transistors and the first group of field effect transistors being PMOS transistors, wherein the first group and the second group are provided on a top surface of a strained semiconductor layer; and selectively providing source and drain regions for the second group.

12. The method of claim 11, further comprising:

providing a silicide layer above the source and drain regions for the first group and the second group.

13. The method of claim 12, further comprising:

providing a silicon dioxide layer over the silicide layer.

14. The method of claim 11, wherein the strained semiconductor layer includes silicon.

15. The method of claim 14, wherein the silicon is above a silicon/germanium layer.

16. The method of claim 15, wherein the offset spacers are approximately 500–2000 angstroms high and approximately 500 angstroms wide.

17. A process of forming source and drain regions on a semiconductor substrate, the process comprising:

forming a plurality of gate structures on a top surface of a strained silicon layer;

covering a first set of gate structures that are part of NMOS transistors;

forming deep source and drain regions on each side of a second set of the gate structures that are part of PMOS transistors;

uncovering the first set of gate structures;

covering the second set of gate structures;

selectively providing spacers for the first set of gate structures; and forming deep source and drain regions on each side of the first set of the gate structures after selectively providing spacers for the first set of gate structures.

18. The process of claim 17, further comprising:

annealing the strained silicon layer after the providing steps.

19. The process of claim 18, wherein the strained silicon layer is provided above a silicon geranium layer.

20. The process of claim 19, wherein the deep source and drain regions are provided by ion implantation.

21. A method of manufacturing an integrated circuit, the method comprising:

providing a first gate structure and a second gate structure on a semiconductor substrate including a strained semiconductor layer, the first gate structure and the second gate structure each including a first spacer, wherein the first gate structure is provided above a first area of the strained semiconductor layer and the second gate structure is provided above a second area of the strained semiconductor layer;

providing a first masking layer above the first area;

forming first deep source and drain regions in the strained semiconductor layer in the second area;

removing the first masking layer;

masking the second area with a second masking layer;

selectively providing a second spacer to the first gate structure; and forming second deep source and drain regions in the strained semiconductor layer in the first area;

wherein the first and second spacers comprise nitride.

* * * * *